United States Patent
Nakase (10) Patent No.: US 9,247,186 B2
(45) Date of Patent: Jan. 26, 2016

(54) VIDEO DISPLAY APPARATUS

(71) Applicant: PANASONIC CORPORATION, Osaka (JP)

(72) Inventor: Kiyotaka Nakase, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 298 days.

(21) Appl. No.: 13/835,732

(22) Filed: Mar. 15, 2013

(65) Prior Publication Data

US 2013/0201413 A1 Aug. 8, 2013

Related U.S. Application Data

(63) Continuation of application No. PCT/JP2012/000171, filed on Jan. 13, 2012.

(30) Foreign Application Priority Data

Jan. 14, 2011 (JP) .................................. 2011-005806

(51) Int. Cl.
*H04N 5/64* (2006.01)
*H05K 5/02* (2006.01)
*H05K 9/00* (2006.01)

(52) U.S. Cl.
CPC .. *H04N 5/64* (2013.01); *H05K 5/02* (2013.01); *H05K 9/0054* (2013.01)

(58) Field of Classification Search
CPC ........ H04N 5/64; H05K 1/147; H01J 2211/48
See application file for complete search history.

(56) References Cited

U.S. PATENT DOCUMENTS

2004/0113532 A1 6/2004 Oishi et al.
2006/0158837 A1 7/2006 Kim et al.
(Continued)

FOREIGN PATENT DOCUMENTS

JP 8-125950 5/1996
JP 2003-131580 5/2003
(Continued)

OTHER PUBLICATIONS

International Preliminary Report on Patentability and Written Opinion of the International Searching Authority issued Jul. 25, 2013 in International (PCT) Application No. PCT/JP2012/000171.
(Continued)

*Primary Examiner* — Huy T Nguyen
(74) *Attorney, Agent, or Firm* — Wenderoth, Lind & Ponack, L.L.P.

(57) ABSTRACT

A panel of a plasma display apparatus includes a front substrate and a back substrate arranged in opposition to this front substrate, and an outer circumferential portion of the front substrate and an outer circumferential portion of the back substrate are adhered to each other by a sealing material. The panel is held on a front side of a chassis base portion of a chassis member. A conductive member fixed to an outer circumferential portion of the chassis member includes a first bent portion bent to a back side at a portion located inside a portion where the conductive member is fixed to the chassis member and a first extending portion extending to the back side from the first bent portion. Occurrence of a crack of the panel due to drop impact, vibration, and external force can be prevented.

6 Claims, 11 Drawing Sheets

(56) References Cited

U.S. PATENT DOCUMENTS

| | | | |
|---|---|---|---|
| 2006/0284559 A1* | 12/2006 | Naoi et al. | 313/586 |
| 2006/0292723 A1 | 12/2006 | Fukui | |
| 2007/0188413 A1* | 8/2007 | Furukawa et al. | 345/67 |
| 2009/0195157 A1* | 8/2009 | Komaba | 313/582 |
| 2009/0251390 A1 | 10/2009 | Kumoi et al. | |
| 2010/0085334 A1* | 4/2010 | Kim et al. | 345/204 |

FOREIGN PATENT DOCUMENTS

| | | |
|---|---|---|
| JP | 2004-206076 | 7/2004 |
| JP | 2006-203158 | 8/2006 |
| JP | 2006-343591 | 12/2006 |
| JP | 2009-251065 | 10/2009 |
| WO | 2005/022493 | 3/2005 |

OTHER PUBLICATIONS

International Search Report issued Apr. 10, 2012 in International (PCT) Application No. PCT/JP2012/000171 with English translation.

\* cited by examiner

VIDEO DISPLAY APPARATUS

CROSS-REFERENCE TO RELATED APPLICATIONS

This is a continuation application of International Application No. PCT/JP2012/000171, with an international filing date of Jan. 13, 2012, which claims priority of Japanese Patent Application No.: 2011-005806 filed on Jan. 14, 2011, the content of which is incorporated herein by reference.

BACKGROUND

1. Technical Field

The technical field relates to a flat panel display type of video display apparatus such as a plasma display apparatus in which a plasma display panel (hereinafter, referred to as a panel) is used as a display device.

2. Description of Related Art

A panel used in this plasma display apparatus is roughly divided into an AC type and a DC type in terms of driving, and divided into two types of a surface discharge type and a facing discharge type in terms of discharge form. In terms of increase in definition and screen size, and ease of manufacturing, currently, a mainstream of the plasma display apparatus is of the surface discharge type of a three-electrode structure.

In this plasma display panel structure of the surface discharge type, at least on a front surface side, a pair of transparent substrates is arranged in opposition so as to form a discharge space between the substrates, and partition walls to partition the discharge space into a plurality of spaces are arranged in the substrates. Moreover, electrode groups are arranged in the substrates so that the discharge is generated in the discharge spaces partitioned by the partition walls, and fluorescent materials that emit light in red, green and blue by the discharge are provided to construct a plurality of discharge cells. The fluorescent materials are excited by vacuum-ultraviolet light having a short wavelength generated by the discharge to emit visible red, green and blue light from the red, green and blue discharge cells, respectively, by which color display is performed.

The above-described plasma display apparatus is characterized in that high-speed display is enabled, a view angle is wide, an increase in size is easy, display quality is high because of self-luminous type and so on, as compared with a liquid crystal panel. Thus, recently, of the flat panel displays, the plasma display apparatus has particularly attracted attention, and has been used for various purposes as a video display apparatus at a place where many people gather or as a video display apparatus to enjoy a large-screen video at home.

In the above-described plasma display apparatus, a panel made of glass as a main material is held on the front side of a chassis member made of metal such as iron, aluminum and the like, and a circuit board making up a drive circuit to emit light in the panel is arranged on a back surface side of the chassis member to thereby construct a module (refer to JP 2003-131580 A).

SUMMARY

In recent years, in the plasma display apparatus, demand for thinning of a product has been increased for improvement in design property.

Advancing the thinning of the plasma display apparatus in this manner decreases strength of the product, and poses a possibility that a panel crack is caused by drop impact and vibration during transportation, and external force during installation. Countermeasures against the drop impact and the vibration, and the external force are necessary not only in the plasma display apparatus, but also in the case of another flat display type of video display apparatuses.

One non-limiting and exemplary embodiment provides a video display apparatus in which a panel crack is hardly caused even if it is subjected to drop impact and vibration, and external force.

In order to solve the above-described problem, a video display apparatus of the present disclosure includes a display panel including a front substrate and a back substrate arranged in opposition to the front substrate, a chassis member holding the display panel on a front side thereof, a casing containing the display panel and the chassis member, and a conductive member for forming an electromagnetic field cooperating with the casing, the conductive member being fixed to an outer circumferential portion of the chassis member. The conductive member includes a bent portion bent to a back side at a portion located inside a portion where the conductive member is fixed to the chassis member and an extending portion extending to the back side from the bent portion.

According to the present disclosure, there can be provided a plasma display apparatus that can easily obtain predetermined strength, even when the product is made thinner, and in which a panel crack is hardly caused even if the apparatus is subjected to drop impact and vibration, and external force.

DETAILED DESCRIPTION

Figure 1:
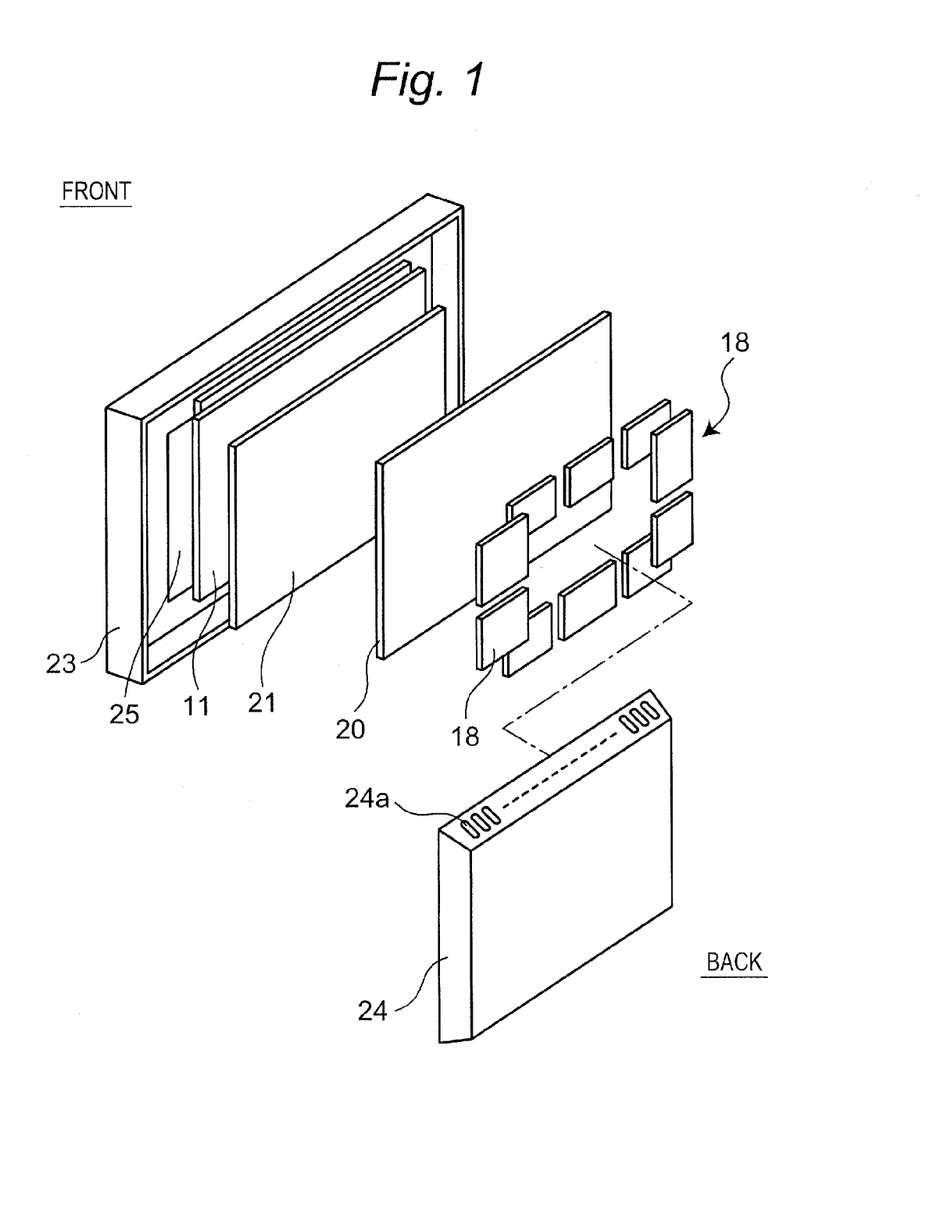
FIG. 1 is an exploded perspective view when a plasma display apparatus according to an embodiment of the present disclosure is seen from a back side.

While a plasma display apparatus according to one embodiment of the present disclosure will be described with reference to FIGS. 1 to 10, aspects for carrying out the present disclosure are not limited thereto. Moreover, meanings of terms regarding positions and directions in the following description are as follows, unless they are particularly mentioned. Referring to FIG. 1, for the terms "front" and "back", a display panel 11 (hereinafter, simply referred to as a "panel") is used as a reference. That is, of both surfaces of the panel 11, a side where an image is displayed in an image display area (refer to reference A in FIG. 7) is "front", and an opposite side thereof is "back". For "inside" and "outside", the image display area "A" is used as a reference. That is, a position near a center of the image display area "A" with respect to a specific position is "inside" the specific position. On the contrary, a position far from the center of the image display area "A" with respect to a specific position is "outside" the specific position. The terms "upper", "lower", "left" and "right" are based on direction references when the panel 11 is seen from the front side of the plasma display apparatus, which is in a posture in use.

As shown in FIG. 1, the plasma display apparatus includes the substantially rectangular plate-like panel 11, and a chassis member 20 that holds the panel 11 through a heat release sheet 21 in front, and on the back side of which drive circuit blocks 18 to drive the panel 11 are arranged. The chassis member 20 also has a substantially rectangular plate shape as a whole. A module including the panel 11, the chassis member 20, and the drive circuit blocks 18 is contained inside a casing having a front cover 23 arranged on the front side of the panel 11 and a back cover 24 made of metal arranged on the back side of the chassis member 20. In the back cover 24, a plurality of vent holes 24a to release heat generated in the module outside are provided. In order to make understanding of a whole structure easy, structures of the respective elements are simplified in FIG. 1, and illustration of a conductive member 35 described later is omitted.

Figure 2:
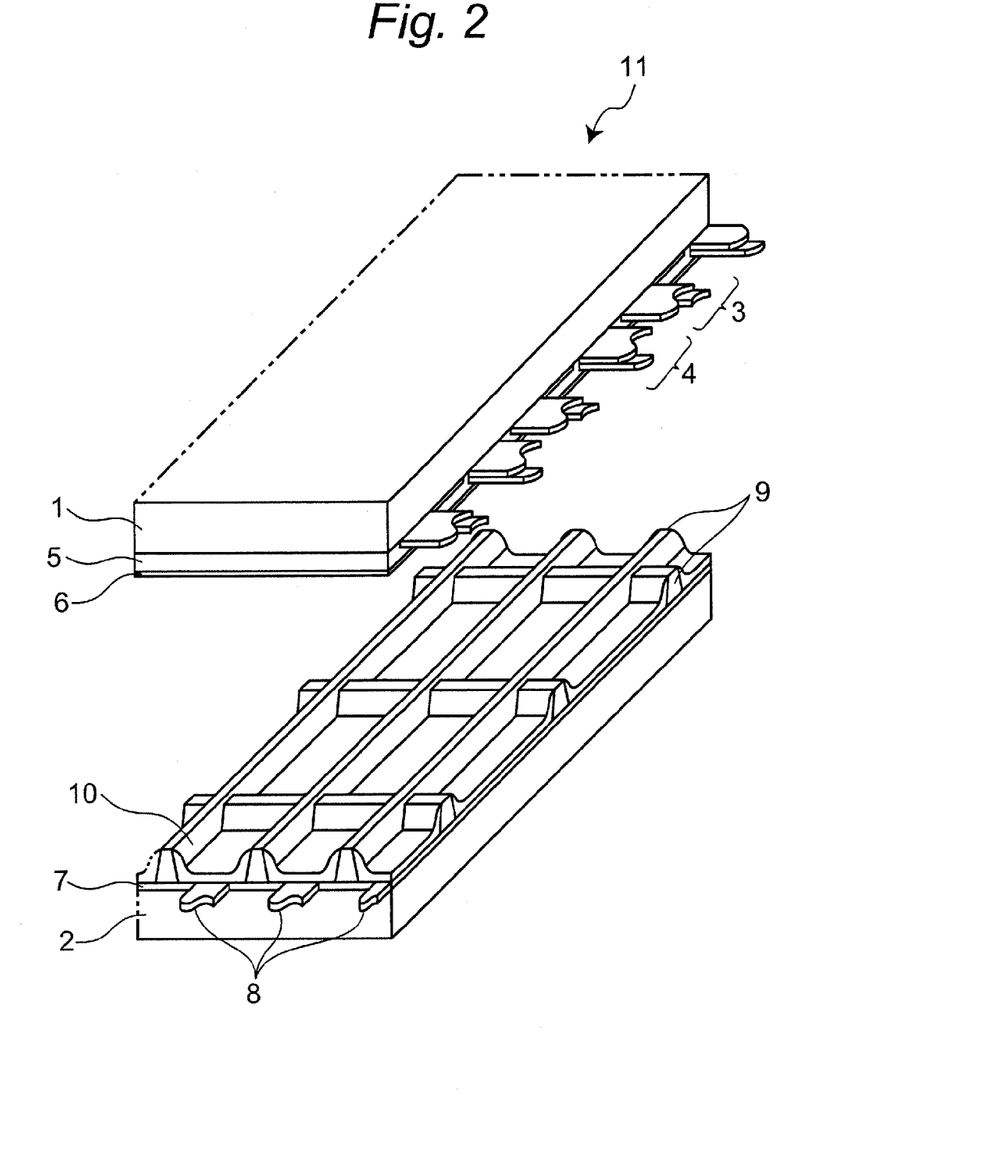
FIG. 2 is a perspective view showing a substantial portion of a panel.

First, a structure of the panel 11 will be described with reference to FIG. 2. As shown in FIG. 2, the panel is constructed by arranging a front substrate 1 and a back substrate 2 made of glass in opposition so as to form a discharge space therebetween. On the front substrate 1, a plurality of scanning electrodes 3 and sustaining electrodes 4 composing display electrodes are formed parallel to one another so as to be paired. A dielectric layer 5 is formed so as to cover the scanning electrodes 3 and the sustaining electrodes 4, and on the dielectric layer 5, a protective layer 6 is formed.

Moreover, a plurality of data electrodes 8 covered with an insulator layer 7 is provided on the back substrate 2, and parallel cross-shaped partition walls 9 are provided on the insulator layer 7. Also, a fluorescent material layer 10 is provided on a surface of the insulator layer 7 and side surfaces of the partition walls 9. The front substrate 1 and the back substrate 2 are arranged in opposition so that the scanning electrodes 3 and the sustaining electrodes 4, and the data electrodes 8 cross one another, and mixed gas of, for example, neon and xenon is included and sealed as discharge gas in the discharge space formed therebetween. Discharge cells are each formed at a portion where one paired scanning electrode 3 (SCi: i=1–n) and sustaining electrode 4 (SUi: i=1–n), and one of the data electrodes 8 (Dj: j=1–m) cross one another, so that the (m×n) discharge cells are formed inside the discharge space. The structure of the panel is not limited to the foregoing, and the panel may include, for example, stripe-shaped partition walls.

Figure 3:
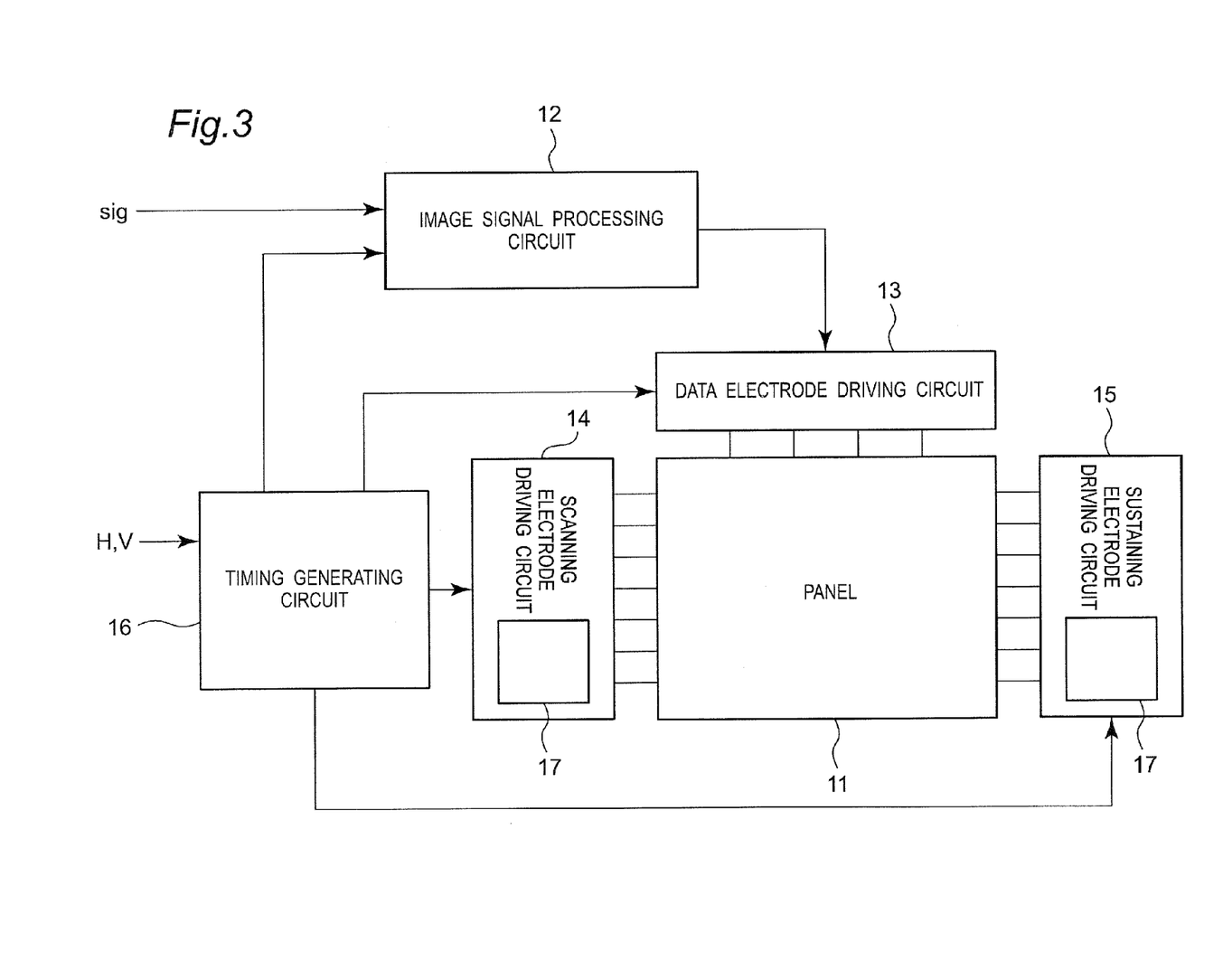
FIG. 3 is circuit block diagram of the plasma display apparatus according to the embodiment of the present disclosure.

FIG. 3 is a circuit block diagram of the plasma display apparatus using this panel. This plasma display apparatus includes the panel 11, an image signal processing circuit 12, a data electrode driving circuit 13, a scanning electrode driving circuit 14, a sustaining electrode driving circuit 15, a timing generating circuit 16, and a power supply circuit (not shown).

The image signal processing circuit 12 converts an image signal sig to image data for each subfield. The data electrode driving circuit 13 converts the image data for each subfield to a signal corresponding to each of the data electrodes 8 (D1 to Dm) to drive each of the data electrodes 8 (D1 to Dm). The timing generating circuit 16 generates various timing signals, based on a horizontal synchronizing signal H and a vertical synchronizing signal V to supply the same to the respective drive circuit blocks 18 (the data electrode driving circuit 13, the scanning electrode driving circuit 14, the sustaining electrode driving circuit 15). The scanning electrode driving circuit 14 supplies a drive voltage waveform to the scanning electrodes 3 (SC1 to SCn), based on the timing signal. The sustaining electrode driving circuit 15 supplies a drive voltage waveform to the sustaining electrodes 4 (SU1 to SUn), based on the timing signal. Here, the scanning electrode driving circuit 14 and the sustaining electrode driving circuit 15 each includes a sustaining pulse generating unit 17.

Figure 4:
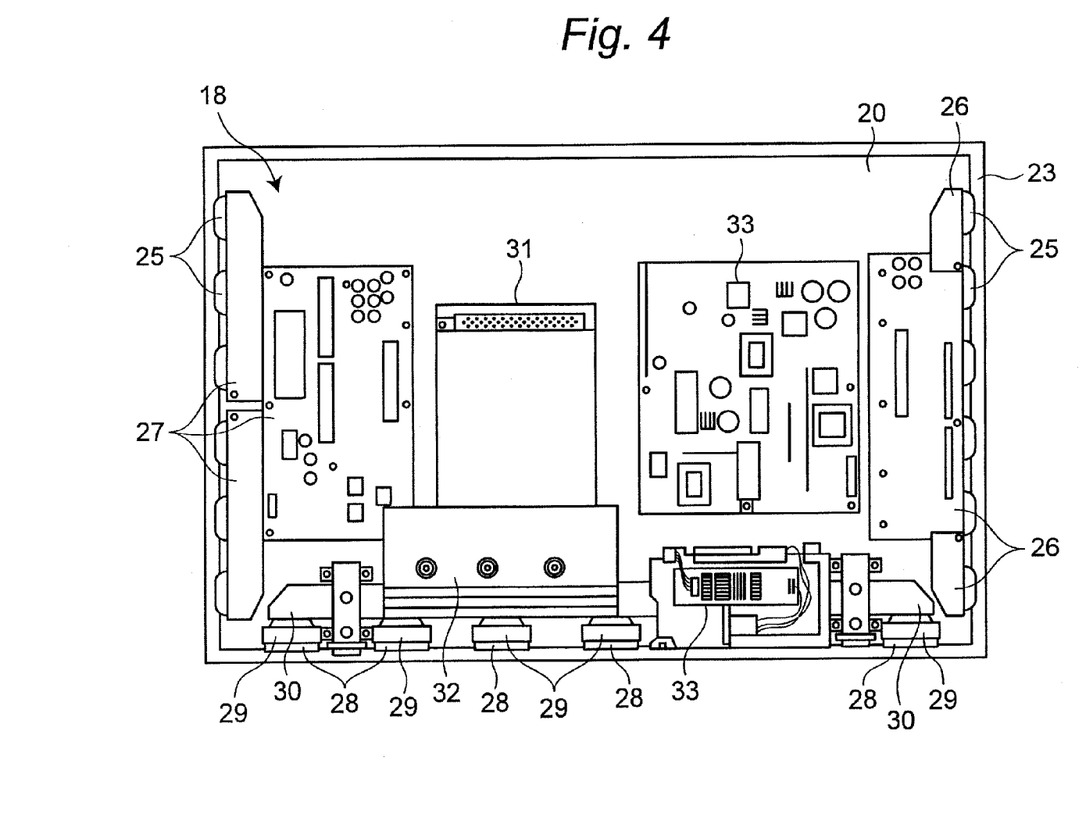
FIG. 4 is a back view of the plasma display apparatus according to the embodiment of the present disclosure in a state where a back cover is removed.

Referring back to FIG. 1, the chassis member 20 as a holding plate functions also as a heat release plate made of one metal plate such as iron and aluminum. A structure of this chassis member 20 will be described later. On the front side of this chassis member 20, the panel 11 adheres by an adhesive or the like to be held with the heat-release sheet 21 interposed between the panel 11 and the chassis member 20. On the back side of the chassis member 20, as shown in FIG. 4, the plurality of drive circuit blocks 18 to drive the display of the panel 11 are arranged.

The heat release sheet 21 allows the panel 11 to adhere to the front side of the chassis member 20 to be held, so that heat generated in the panel 11 is efficiently transmitted to the chassis member 20 to be released, and has a thickness of about 1 mm to 2 mm. As this heat release sheet 21, an insulating heat release sheet obtained by containing a filler to increase heat conductivity in a synthetic resin material such as acrylic, urethane and silicon resins, rubber and the like, a graphite sheet, a metal sheet or the like can be used. Moreover, such a structure can be used, in which the heat release sheet 21 itself has adhesion force so that the panel 11 adheres to the chassis member 20 only by the heat release sheet 21, or in which the heat release sheet 21 has no adhesion force and the panel 11 adheres to the chassis member 20 using a double-faced adhesive tape, or the like.

Figure 5A:
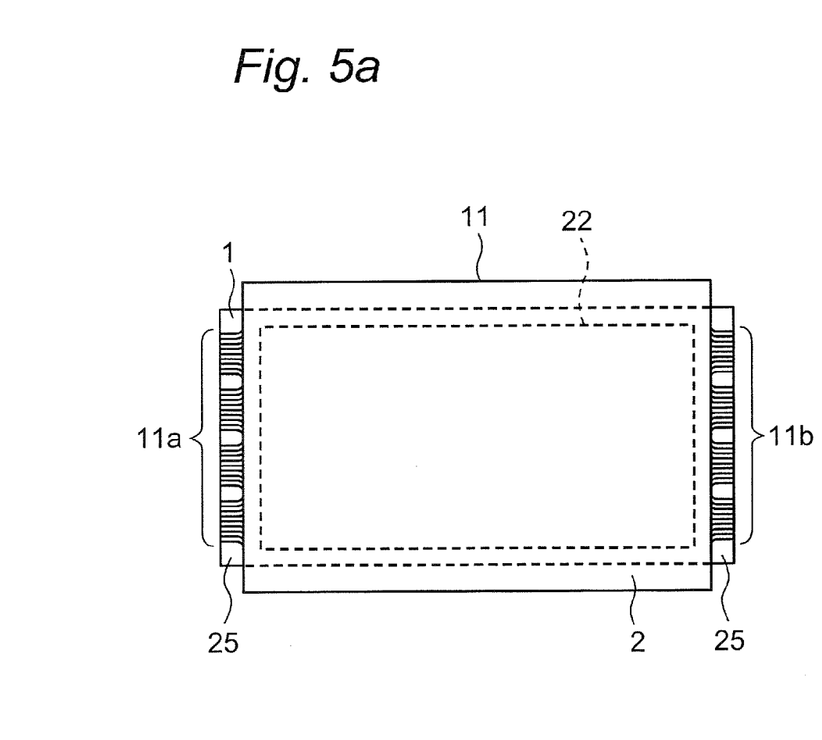
FIG. 5a is a front view of the plasma display apparatus according to the embodiment of the present disclosure.
Figure 5B:
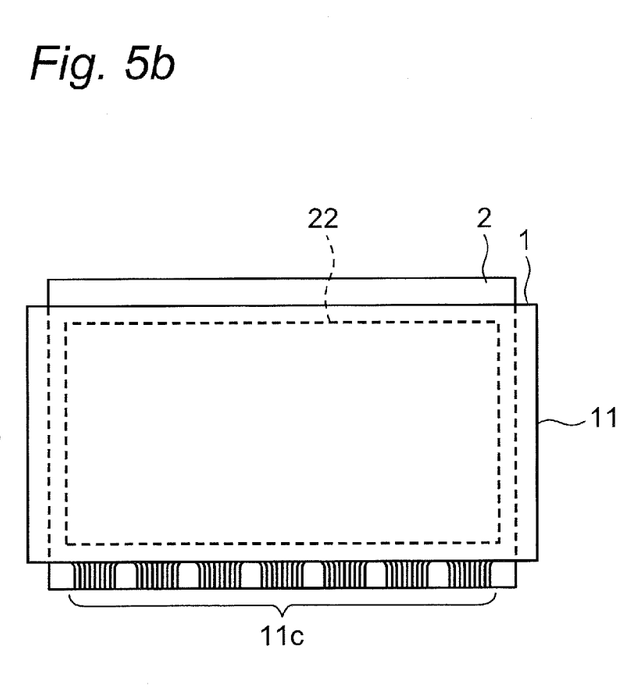
FIG. 5b is a back view of the plasma display apparatus according to the embodiment of the present disclosure.

As shown in FIGS. 5a and 5b, the panel 11 has a structure in which outer circumferential portions of the front substrate 1 and the back substrate 2 are caused to adhere to each other by a sealing material 22 to be thereby stuck to each other. In edge portions on both sides of the panel 11, flexible wiring boards 25 as wiring members for the display electrodes connected to electrode lead-out portions 11a, 11b of the scanning electrodes 3 and the sustaining electrodes 4 are provided. The flexible wiring boards 25 are led to the back side through an outer circumferential portion of the chassis member 20 to be connected to a drive circuit board 27 of the scanning electrode drive circuit 14 and a drive circuit board 26 of the sustaining electrode drive circuit 15 through connectors.

Figure 6:
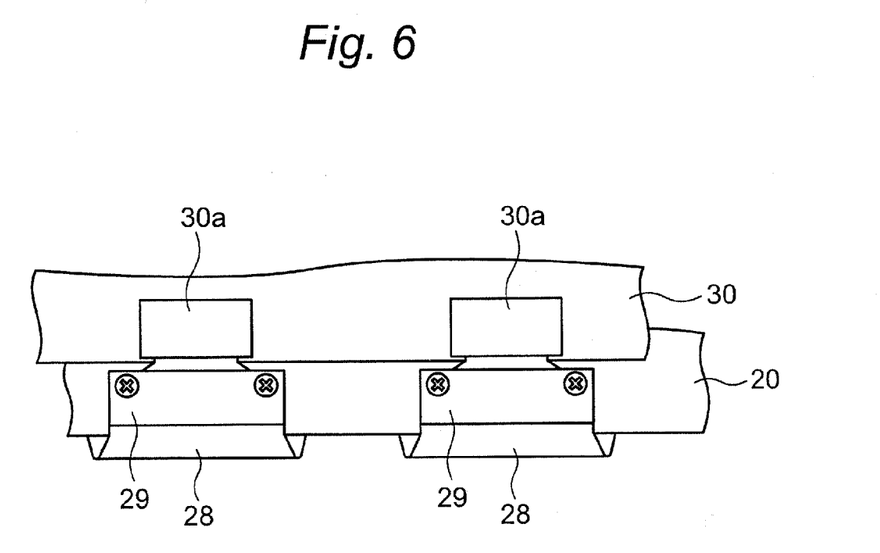
FIG. 6 is a back view showing a structure of a periphery of data drivers of the plasma display apparatus according to the embodiment of the present disclosure.

On the other hand, in a lower end portion of the panel 11, a plurality of flexible wiring boards 28 as wiring boards for the data electrodes connected to electrode terminal portions 11c of the data electrodes 8 are provided. The flexible wiring boards 28 are led to the back side through the outer circumferential portion of the chassis member 20, and are each electrically connected to a plurality of data drivers 29 of the data electrode driving circuit 13 to apply a drive voltage to the data electrodes 8, and further, are electrically connected to a drive circuit board 30 of the data electrode drive circuit 13 arranged in a lower position on the back side of the chassis member 20. In FIG. 6, the data drivers 29 are structured so that a semiconductor chip is arranged on the heat release plate, and a plurality of electrode pads of the semiconductor chip are each connected to wiring patterns of the flexible wiring boards 28. Moreover, in the drive circuit board 30, connectors 30a to connect the flexible wiring boards 28 are provided.

Moreover, a control circuit board 31 (including the image signal processing circuit 12 and the timing generating circuit 16 in FIG. 3) is arranged roughly in a central portion of the chassis member 20. The control circuit board 31 converts the image data to an image data signal in accordance with a number of pixels of the panel 11, based on the image signal sig sent from an input signal circuit block 32 including an input terminal portion to which a connection cable to connect an external device such as a television tuner is connected detachably, and supplies the same to the drive circuit board 30 of the data electrode drive circuit 13. Moreover, the control circuit board 31 generates discharge control timing signals and supplies each to the drive circuit board 26 of the scanning electrode driving circuit 14 and the drive circuit board 27 of the sustaining electrode driving circuit 15 to perform the display drive control such as gradation control.

A power supply block 33 supplies a voltage to the respective circuit blocks, and is arranged roughly in the central portion of the chassis member 20 as with the control circuit board 31. A commercial power supply voltage is supplied to the power supply block 33 through a connector to which a power-supply cable (not shown) is attached. In the vicinity of the drive circuit boards 26, 27, 30, cooling fans (not shown) are arranged so as to be held at angles, and wind sent from these cooling fans cool the drive circuit boards 26, 27, 30.

Figure 7:
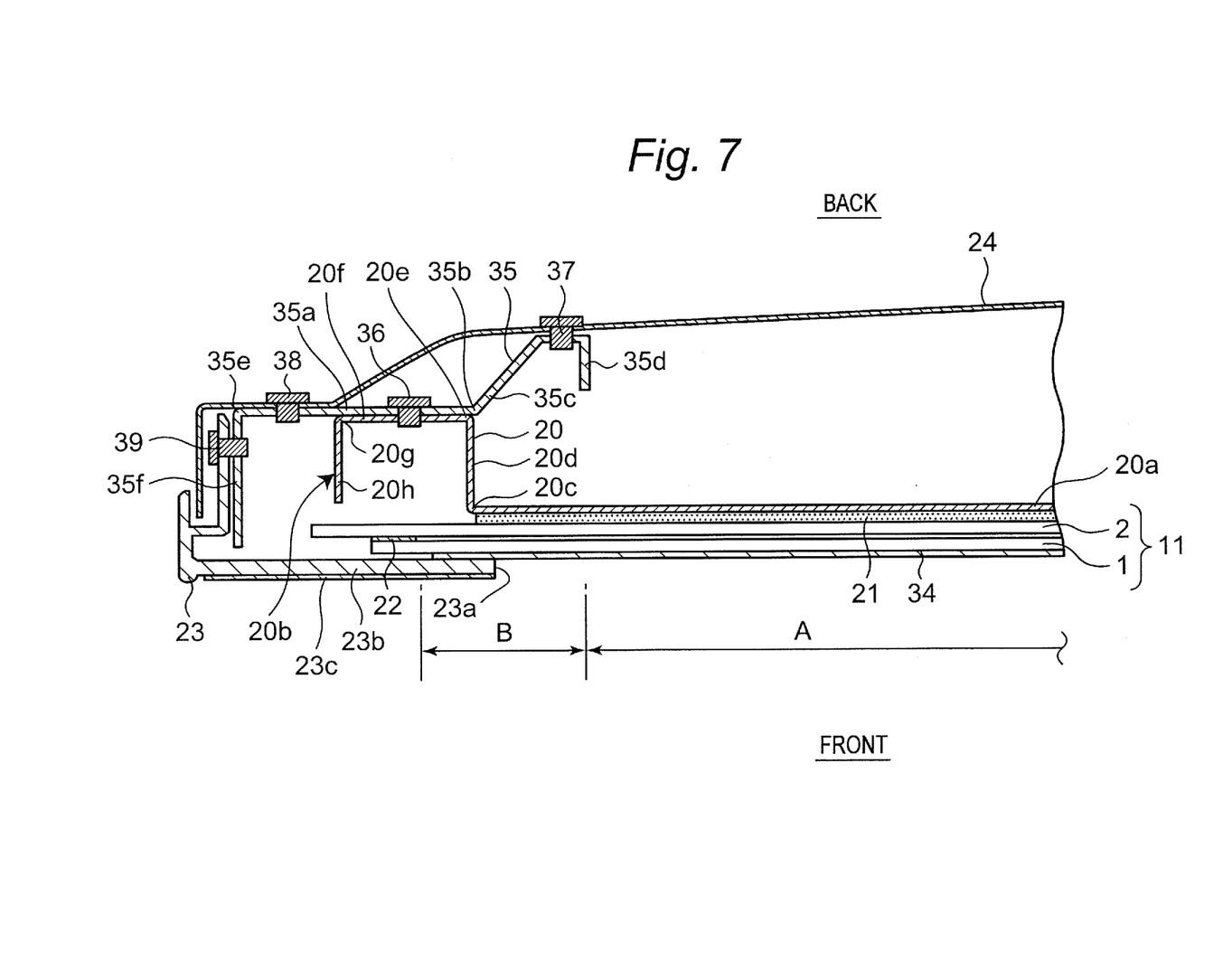
FIG. 7 is a partially enlarged cross-sectional view of the plasma display apparatus according to the embodiment of the present disclosure.

As shown in FIG. 7, on the front side of the panel 11, a front filter 34 provided with an optical filter and a spurious radiation suppressing film to suppress spurious radiation of an electromagnetic wave is stuck. The front cover 23 is made of resin or metal, and has an opening portion 23a where the image display area "A" on the front side of the panel 11 appears. Around the opening portion 23a, a front frame 23b to cover and hide a non-display area is provided so as not to allow a customer to see the same. A decoration plate 23c is stuck to this front frame 23b in order to enhance an outward design of the plasma display apparatus.

Hereinafter, mainly referring to FIG. 7, a reinforcement structure to prevent a crack of the panel 11 due to drop impact and vibration, and external force will be described.

Figure 8:
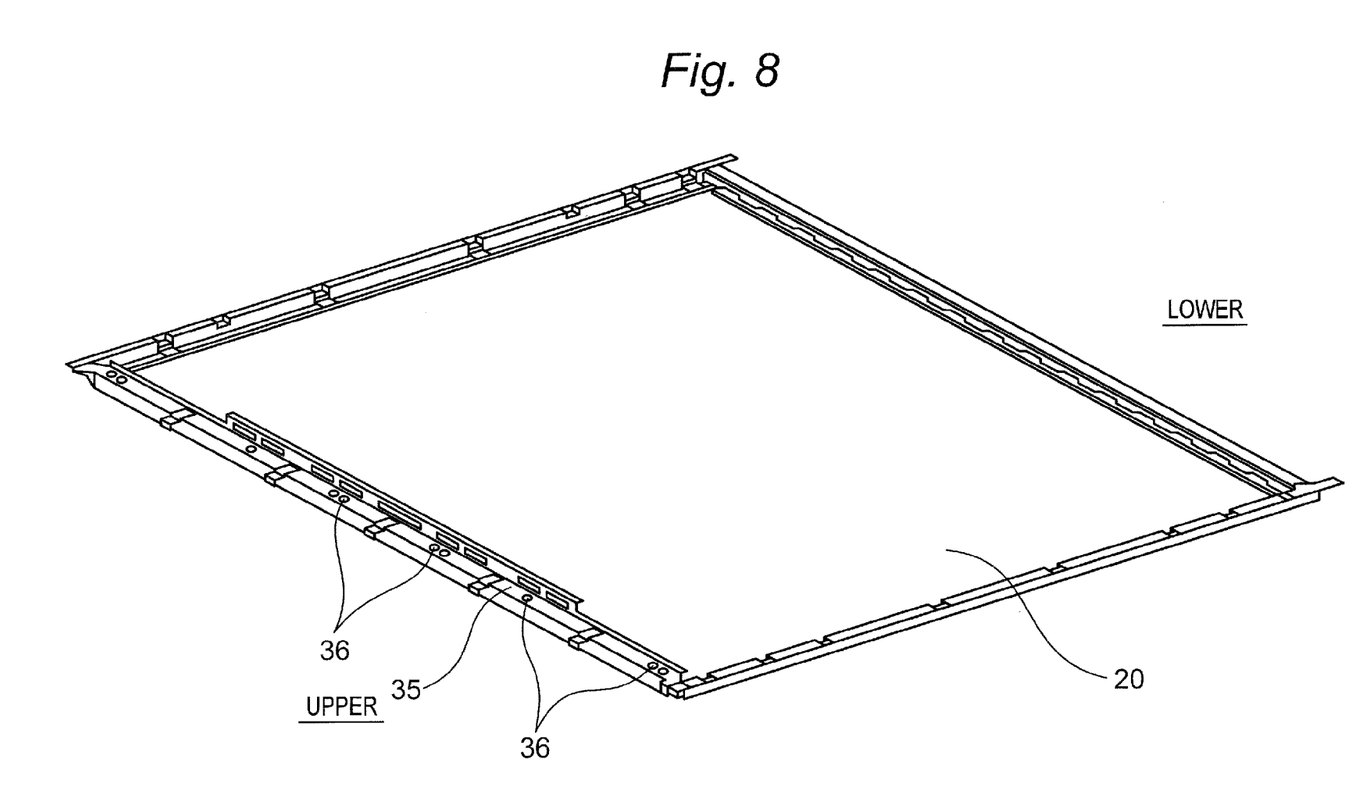
FIG. 8 is a perspective view showing a chassis member and a conductive member included in the plasma display apparatus according to the embodiment of the present disclosure.
Figure 9:
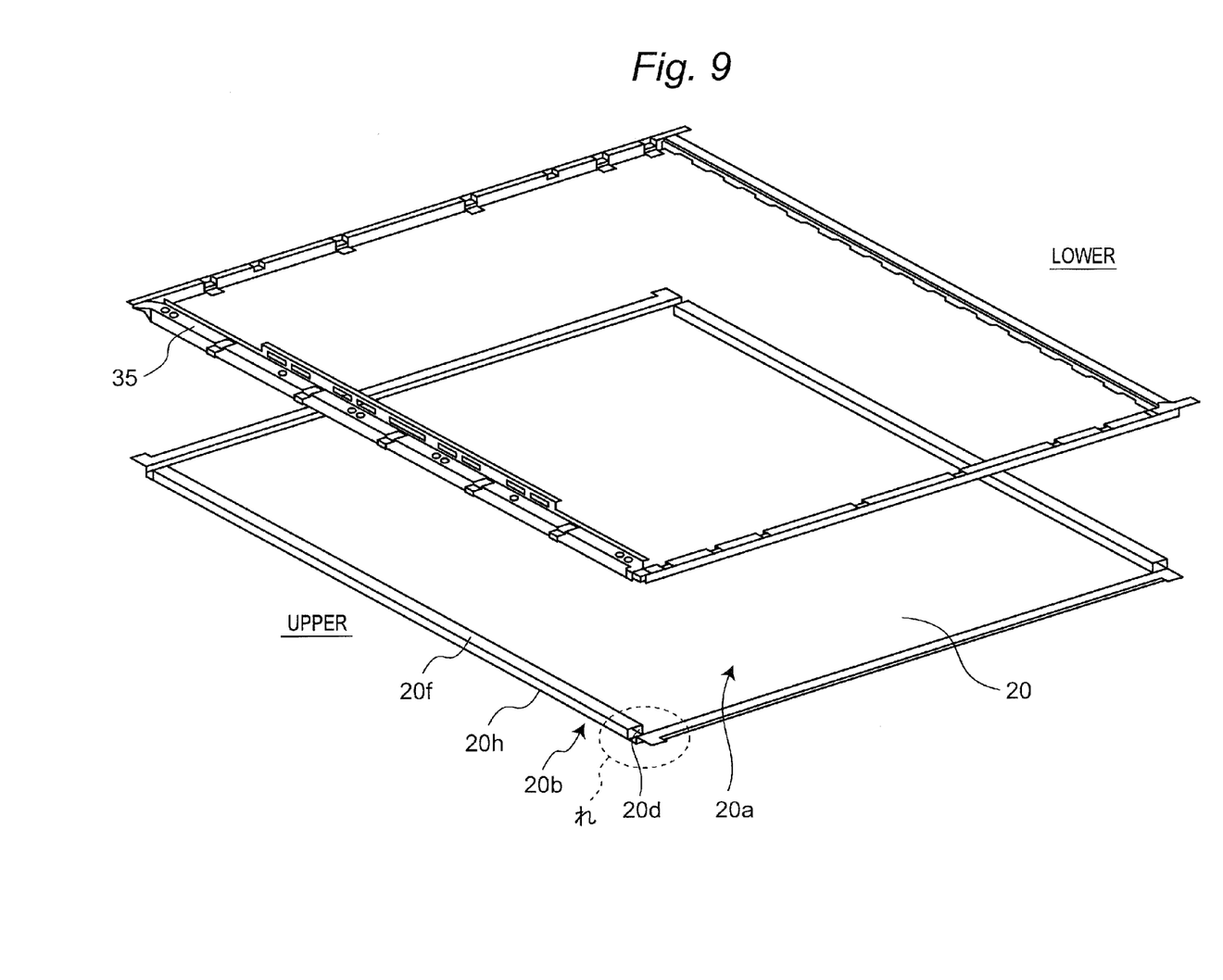
FIG. 9 is an exploded perspective view showing the chassis member and the conductive member included in the plasma display apparatus according to the embodiment of the present disclosure.
Figure 10:
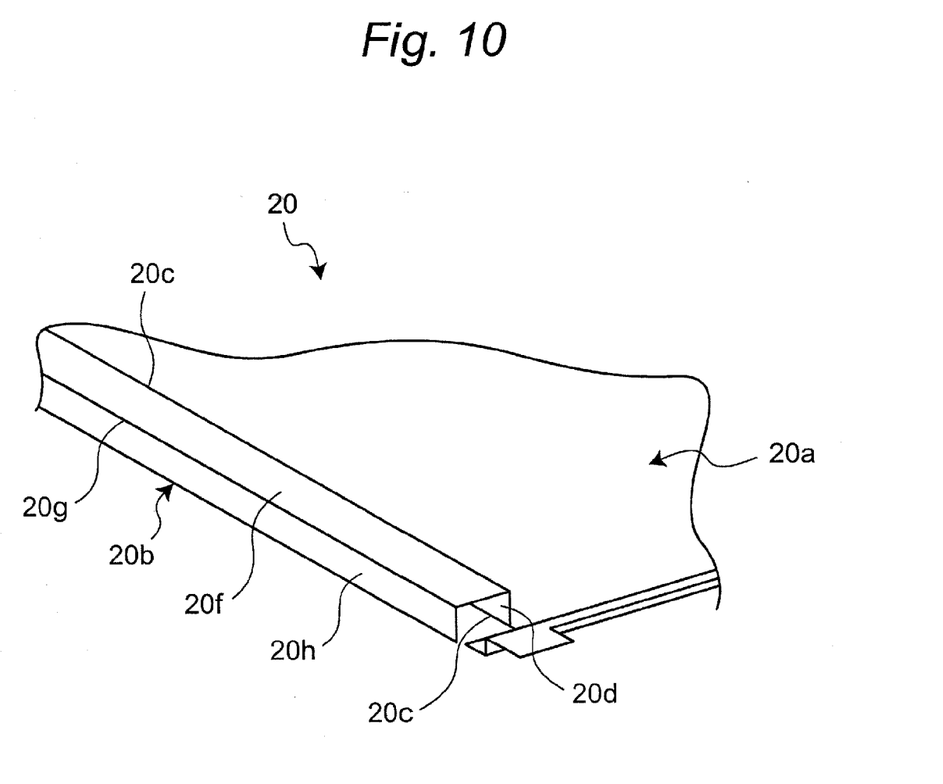
FIG. 10 is an enlarged view of a portion X in FIG. 9.

Referring to FIGS. 8 to 10 in combination, the chassis member 20 includes a substantially rectangular chassis base portion 20a. The panel 11 is held on the front side of the chassis base portion 20a, and the foregoing drive circuit blocks 18 (refer to FIGS. 1 and 4) to drive the panel 11 are arranged on the back side thereof. A reinforcement portion 20b formed by being bent so as to protrude to the back side is provided in an upper outer circumferential end portion of the chassis base portion 20a. Hereinafter, the reinforcement portion 20b will be described in detail.

First, the reinforcement portion 20b has a first bent portion 20c bent to the back side at a substantially right angle to the chassis base portion 20a, and a first extending portion 20d extending in a direction substantially orthogonal to the chassis base portion 20a from this first bent portion 20c toward the back side, at a position outside the image display area "A" and inside an inner end portion of the sealing material 22 (at a position within an area indicated by sign "B"). In other words, at the portion of the first bent portion 20c, the first extending portion 20d rises from the chassis base portion 20a. Further, in other words, while the panel 11 is held with respect to the chassis base portion 20a inside the first bent portion 20c, the panel 11 departs from the chassis base portion 20a outside the bent portion 20c. In the present embodiment, a height from the chassis base portion 20a to a distal end of the first extending portion 20d is about 5 mm to 15 mm.

Moreover, the reinforcement portion 20b includes a second bent portion 20e where the distal end of the first extending portion 20d is bent outward at a substantially right angle, and a second extending portion 20f extending outward from this second bent portion 20e substantially parallel to the chassis base portion 20a.

Furthermore, the reinforcement portion 20b includes a third bent portion 20g where a distal end of the second extending portion 20f is bent to the front side at a substantially right angle, and a third extending portion 20h extending from this third bent portion 20g to the front side at a substantially right angle to the chassis base portion 20a.

Provision of the reinforcement portion 20 having a bent structure having the three bent portions, that is, the first to third bent portions 20c, 20e, 20h increases overall rigidity of the chassis member 20. First, the above-described increase in the overall rigidity of the chassis member 20 makes it difficult to cause a crack of the panel 11 held by the chassis base portion 20a due to drop impact and external force.

As described before, the first bent portion 20c, which forms the rise of the first extending portion 20d from the chassis base portion 20a, is set at the position outside the image display area "A" and inside the inner end portion of the sealing material 22. This position setting of the first bent portion 20c increases tolerance of the panel 11 against the drop impact and the external force. Hereinafter, this point will be described in detail.

Generally, panel crack by the drop impact and external force is often caused, starting from a vicinity of the sealing material 22. In the present embodiment, the first bent portion 20c, where the chassis member 20 starts to depart from the panel 11, is set inside the inner end portion of the sealing material 22. Thus, a portion of the panel 11 outside the first bent portion 20c, that is, the outer circumferential portion (including the portion where the sealing material 22 is arranged) is not held by the chassis member 20. In other words, the portion of the panel 11 outside the first bent portion 20c is in a state like a free end of a cantilever (the first bent portion 20c would be a fixed end of the cantilever). Accordingly, since the drop impact and the external force transmitted from the chassis member 20 to the portion where the sealing material 22 of the panel 11 exists are remarkably reduced, local deformation of the panel 11 in the vicinity of the sealing material 22 can be effectively suppressed, and as a result, the tolerance of the panel 11 against the drop impact and the external force is increased.

On the other hand, it is not preferable in view of quality of the image displayed on the panel 11 that the position of the first bent portion 20c, that is, the position where the chassis member 20 starts to depart from the panel 11 is inside the image display area A. In the present embodiment, the first bent portion 20c is set at the position outside the image display area "A" and inside the inner end portion of the sealing material 22, by which the effective prevention of the crack of the panel 11 is realized without bringing about deterioration in image quality.

In the present embodiment, the second bent portion 20e is further provided at the distal end of the first extending portion 20d, which rises from the first bent portion 20c, and still further, the third extending portion 20h is provided through the third bent portion 20g at the distal end of the second extending portion 20f extending from the second bent portion 20e. The form made up of the three bent portions 20c, 20e, 20g and the three extending portions 20d, 20f, 20h (referred to also as inversed U-like shape) effectively increases the rigidity of the reinforcement portion 20b itself while satisfying the condition that the first bent portion 20c is set at the position outside the image display area "A" and inside the inner end portion of the sealing material 22, as described before. The increase in rigidity of this reinforcement portion 20b itself also increases the tolerance of the panel 11 against the drop impact and the external force, thereby making the occurrence of the crack difficult.

Referring to FIGS. 8 and 9 in combination, in an outer circumference of the chassis member 20, a conductive member 35 resulting from forming an iron plate having a plate thickness of about 0.8 mm to 1.6 mm into a rectangle frame like shape is arranged so as to be located inside the front cover 23.

The conductive member 35 is electively conducted with the spurious radiation suppressing film of the front filter 34 through conductive cloth (not shown) and the like, by which the spurious radiation suppressing film of the front filter 34 is electrically connected to the chassis member 20 through the conductive cloth and the conductive member 35. Moreover, the conductive member 35 is electrically and mechanically connected to both the chassis member 20 and the back cover 24, as described in detail later. That is, the back cover 24 is electrically and mechanically connected to the chassis member 20 through the conductive member 35. This allows the whole module to be electromagnetically shielded by the spurious radiation suppressing film of the front filter 34 and the chassis member 20, and the back cover 24.

Hereinafter, a structure of an upper portion of the conductive member 35 (portion corresponding to the reinforcement portion 20b of the chassis member 20) will be described in detail.

The conductive member 35 includes a body portion 35a extending along the panel 11. A right portion in FIG. 7 of the body portion 35a is placed on the second extending portion 20f of the chassis member 20. This portion is mechanically fixed to the chassis member 20 by fixing members 36, and is electrically connected to the same. While in the present embodiment, the fixing members 36 are rivets or screws, a specific aspect of the fixing members 36 is not particularly limited, as long as they enable mechanical and electrical connection. Moreover, in place of the fixing members 36, the body portion 35a of the conductive member 35 and the second extending portion 20f of the chassis member 20 may be connected, for example, by means of spot welding or the like. In these respects, the same is true with respect to fixing members 37, 38, 39 described later.

In the body portion 35a of the conductive member 35, the right portion thereof in FIG. 7 is protruded beyond the distal end of the second extending portion 20f of the chassis member 20. This portion is mechanically fixed to the back cover 24 by the fixing members 37, which are, for example, rivets or screws, and electrically connected to the same.

The conductive member 35 includes a first bent portion 35b where an inner (right side in FIG. 7) end portion of the site fixed to the chassis member 20 by the fixing members 36 in the body portion 35 is bent to the back side. A first extending portion 35c extends from this first bent portion 35b toward the back cover 24 obliquely to the panel 11 (at an angle toward a center of the image display area "A" with respect to a right angle). An L-shaped bracket portion 35d is provided at a distal end of the first extending portion 35c. This bracket portion 35d is mechanically fixed to the back cover 24 by the fixing members 37 and is electrically connected to the same.

The conductive member 35 includes a second bent portion 35e where an end portion (left end portion in FIG. 7) of a portion protruded outward from the second extending portion 20f of the chassis member 20 in the body portion 35 is bent to the front side. A second extending portion 35f extends from this second bent portion 35e toward the front cover 23 at a substantially right angle to the panel 11. The second extending portion 35f is mechanically fixed to the front cover 23 by the fixing members 38, and is electrically connected to the same.

The first extending portion 35c of the conductive member 35 extends from the distal end of the body portion 35a fixed to the second extending portion 20f of the chassis member 20 by the fixing members 36 toward the back cover 24 that is arranged on the opposite side with respect to the second extending portion 20f extending from the first bent portion 20e of the chassis member 20. Further, the bracket portion 35d at the distal end of the first extending portion 35c is fixed to the back cover 24. This arrangement can increase strength or rigidity of the conductive member 35 and the chassis member 20. That is, in FIG. 7, the second extending portion 20f (whose distal end is fixed to the conductive member 35) of the chassis member 20, and the first extending portion 35c (whose distal end is fixed to the back cover 24) of the conductive member 35 extend in a manner as if the distal end of the first extending portion 20d of the chassis member 20 bifurcates. Such structure has a function of dispersing the drop impact and the external force without concentrating them on any one of the chassis member 20, the conductive member 35 and the back cover 24. The dispersion of the drop impact and the external force increases the strength or the rigidity of the conductive member 35 and the chassis member 20, which can prevent the crack of the panel 11 by impact applied during transportation or the like.

In the present embodiment, the conductive member 35 is fixed to the back cover 24 by the fixing members 37 and the fixing members 38 at positions inside the positions where the conductive member 35 is fixed to the chassis member 20 by the fixing members 36, and outside the same positions, respectively. By fixing the chassis member 20, the back cover 24 and the conductive member 35 in this manner, the strength of an outer circumferential portion of the casing of the plasma display apparatus is increased, which can suppress deformation of the panel stuck to the chassis member 20, and can prevent the panel crack by the impact applied during transportation or the like. Moreover, by increasing the strength of the outer circumferential portion of the casing of the plasma display apparatus, sufficient strength can be assured even if a side wall dimension of the casing is made smaller, and thinning of the casing of the plasma display apparatus can be achieved. In the present embodiment, while the conductive member 35 is fixed to the back cover 24 by the fixing members 38, and is fixed to the front cover 23 by the fixing members 39, the back cover 24 may be fixed to the casing by only any one of the fixing members 38, 39, as long as sufficient strength can be assured.

Figure 11:
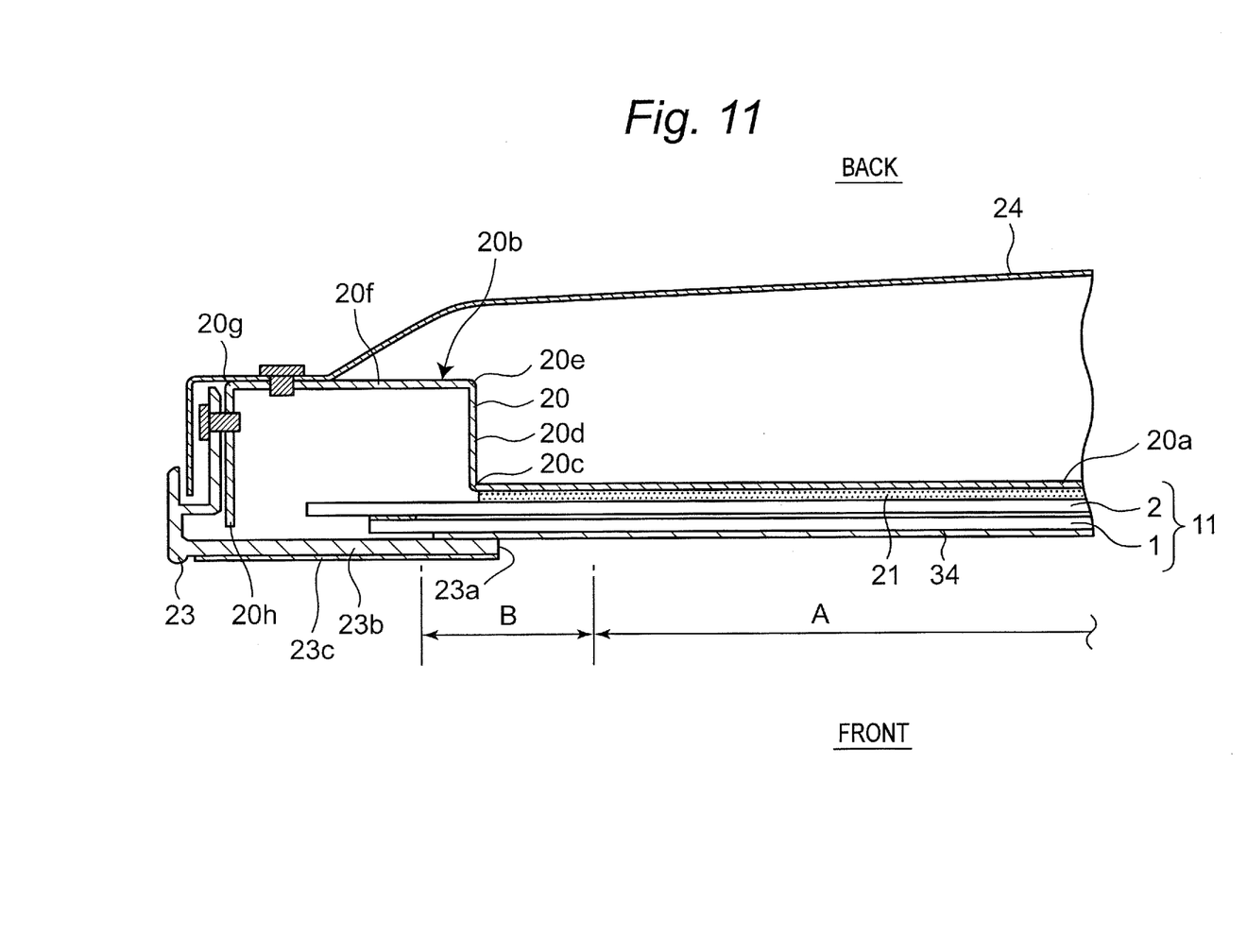
FIG. 11 is a cross-sectional view showing an alternative example where the conductive member is not included.

For the structure of the reinforcement portion 20b of the chassis member 20 in the present embodiment, a case can be employed, where the conductive member 35 is not used, as shown in FIG. 11. In the case of FIG. 11, the second extending portion 20f of the reinforcement portion 20b is mechanically and electrically fixed to the back cover 24 by the fixing members 36, and the third extending portion 20g of the reinforcement portion 20b is mechanically and electrically fixed to the front cover 23 by the fixing members 39.

As described above, in the present embodiment, the panel 11 is held on the front side of the chassis base portion 20a of the chassis member 20, the panel 11 having the structure in which the front substrate 1 and the back substrate 2 arranged in opposition to this front substrate 1 are included, and the outer circumferential portion of the front substrate 1 and the outer circumferential portion of the back substrate 2 are caused to adhere to each other by the sealing material 22, and the chassis member 20 includes the reinforcement portion 20b having at least the first bent portion 20c where the chassis base portion 20a is bent to the back side at the position outside the image display area "A" of the panel 11 and inside the sealing material 22, and the first extending portion 20d extending from the first bent portion 20c to the back side. This enables the structure in which the panel outer circumferential portion serves as a free end against the panel crack by the drop impact and the external force caused, starting from the vicinity of the sealing material 22, local deformation can be suppressed in the vicinity of the sealing material 22, so that the crack of the panel 11 can be prevented without bringing about deterioration in image quality.

Moreover, the conductive member 35 fixed to the outer circumferential portion of the chassis member 20 has the first bent portion 35b where the inside of the site fixed to the chassis member 20 is bent to the back side, and the first extending portion 35c extending from this bent portion 35b to the back side, by which the strength of the conductive member 35 and the chassis member 20 can be improved.

Furthermore, the conductive member 35 is fixed to the back cover 24 by the fixing members 37 and the fixing members 38 at the positions inside the positions where the conductive member 35 is fixed to the chassis member 20 by the fixing members 36, and outside the same positions, respectively. In other words, the conductive member 35 is fixed to the back cover 24 of the casing by the fixing members 37 (first fixing member) inside the site fixed to the chassis member 20, and is also fixed to the back cover 24 by the fixing members 38, 39 outside the site fixed to the chassis member 20. This can suppress the deformation of the panel stuck to the chassis member 20, and can prevent the panel crack by the impact applied during transportation or the like.

While taking the plasma display apparatus as an example, the present disclosure has been described, the present disclosure can be also applied to a flat panel display type of video display apparatus having a similar structure.

As described above, the present disclosure is useful in providing a flat panel display type of video display apparatus such as a plasma display apparatus which is thin, and in which a panel crack due to drop impact and vibration, and external force is hardly caused.

Various modifications and alterations of the disclosure will become apparent to those skilled in the art without departing from the spirit and scope of the disclosure, which is defined by the accompanying claims.

What is claimed is:

1. A video display apparatus comprising:
 a display panel including a front substrate and a back substrate arranged in opposition to the front substrate;
 a chassis member holding the display panel on a front side of the chassis member;
 a casing containing the display panel and the chassis member; and
 a conductive member for forming an electromagnetic shield with the casing and the chassis member, the conductive member being fixed to an outer circumferential portion of the chassis member,
 wherein the conductive member includes a bent portion located inward of a portion of the conductive member fixed to the chassis member, the bent portion being bent toward a back side of the casing, and an extending portion extending to the back side of the casing from the bent portion.

2. The video display apparatus according to claim 1, wherein the extending portion of the conductive member is fixed to the casing.

3. The video display apparatus according to claim 2, wherein the casing includes a front cover at a front side of the display panel and a back cover at a back side of the display panel, and
 wherein the extending portion of the conductive member is fixed to the back cover of the casing.

4. The video display apparatus according to claim 1, wherein the chassis member includes a reinforcement portion formed by bending the outer circumferential portion so as to extend toward the back side of the casing, and
 wherein the conductive member is fixed to the reinforcement portion of the chassis member.

5. The video display apparatus according to claim 1, wherein the display panel is a plasma display panel in which a discharge space is formed between the front substrate with a plurality of display electrodes arranged thereon and the back substrate with data electrodes arranged thereon that cross the display electrodes.

6. The video display apparatus according to claim 5, further comprising a drive circuit block to drive the plasma display panel arranged on a back side of the chassis member.

* * * * *